United States Patent
Fujita et al.

(10) Patent No.: US 8,569,955 B2
(45) Date of Patent: Oct. 29, 2013

(54) PLASMA GENERATOR

(75) Inventors: Hideki Fujita, Kyoto (JP); Tetsuya Igo, Kyoto (JP)

(73) Assignee: Nissin Ion Equipment Co., Ltd, Kyoto (JP)

(*) Notice: Subject to any disclaimer, the term of this patent is extended or adjusted under 35 U.S.C. 154(b) by 167 days.

(21) Appl. No.: 13/198,429

(22) Filed: Aug. 4, 2011

(65) Prior Publication Data

US 2012/0049738 A1 Mar. 1, 2012

(30) Foreign Application Priority Data

Aug. 24, 2010 (JP) ................................. 2010-186824

(51) Int. Cl.
*H05B 31/26* (2006.01)

(52) U.S. Cl.
USPC ................................ 315/111.21; 315/111.81

(58) Field of Classification Search
USPC ............. 315/111.11, 111.21, 111.31, 111.71, 315/111.81, 111.91; 156/345.35, 345.36, 156/345.38, 345.4, 345.41, 345.43, 345.44, 156/345.46, 345.47, 345.48
See application file for complete search history.

(56) References Cited

U.S. PATENT DOCUMENTS

| | | | |
|---|---|---|---|
| 6,452,198 B1 | 9/2002 | Mani et al. | |
| 6,852,990 B1 | 2/2005 | Zhao et al. | |
| 7,342,240 B2 | 3/2008 | Walther et al. | |
| 2002/0046808 A1* | 4/2002 | Hongo et al. | 156/345.41 |
| 2007/0137576 A1 | 6/2007 | Kurunczi et al. | |
| 2008/0236494 A1* | 10/2008 | Kawaguchi et al. | 118/723 R |
| 2009/0194235 A1* | 8/2009 | Kobayashi et al. | 156/345.28 |
| 2009/0242128 A1* | 10/2009 | Tago et al. | 156/345.28 |
| 2009/0311866 A1* | 12/2009 | Sakamoto et al. | 438/694 |
| 2010/0163403 A1* | 7/2010 | Kitada et al. | 204/164 |

FOREIGN PATENT DOCUMENTS

JP 2002-324511 A 11/2002

* cited by examiner

*Primary Examiner* — Minh D A
(74) *Attorney, Agent, or Firm* — Procopio, Cory, Hargreaves & Savitch LLP

(57) ABSTRACT

A plasma generator generates a plasma by ionizing a gas with a high-frequency discharge in a plasma generating chamber so that electrons from the plasma are emitted outside the plasma generator through an electron emitting hole. The plasma generator includes an antenna that is provided in the plasma generating chamber and that emits a high-frequency wave, and an antenna cover that is made of an insulating material and that covers an entire body of the antenna. A plasma electrode having the electron emitting hole is made of a conductive material. A frame cover with a protrusion ensures conductivity by preventing an insulating material from accumulating on a surface of the plasma electrode on a plasma side in sputtering by the plasma.

1 Claim, 7 Drawing Sheets

Section A-A

View along arrow A-A

PLASMA GENERATOR

BACKGROUND OF THE INVENTION

1. Field of the Invention

The present invention relates to a high-frequency discharge plasma generator that is used for suppressing an electrostatic charge (charge-up), etc., on a surface of a substrate when ion beam irradiation is carried out in an ion beam irradiation device that performs ion implantation, etc., by, for example, irradiating the substrate with an ion beam.

2. Description of the Related Art

A plasma generator is disclosed in Japanese Patent Application Laid-open No. 2002-324511 (Paragraphs 0031 to 0038 and FIG. 1) as an example of a high-frequency discharge plasma generator described above used for suppressing an electrostatic charge on a surface of a substrate. The disclosed plasma generator generates a plasma by ionizing a gas with a high-frequency discharge in a plasma generating chamber. As a result, electrons from the plasma are emitted outside the plasma generating chamber through electron emitting holes. In this plasma generator, an inner wall and an antenna of the plasma generating chamber are covered with an insulator to prevent metal contamination produced in sputtering by the plasma and adhering of the conductive sputtered material to the antenna.

The principal object of providing the insulator on the inner wall is to prevent contamination (that is, metallic contamination) of the plasma from occurring. That is, to prevent particles of metal constituting the inner wall being discharged in the plasma from the antenna in sputtering by the plasma.

Alumina, etc., is used as the material of the insulator. An extracting power supply 56 is connected between a plasma electrode 16, which has electron emitting holes, and a target chamber 8. The plasma electrode 16 is made of a conductive material such as carbon. A current that flows through the extracting power supply 56 is called a PFG current Ipfg and is a measure of the electrons that are emitted to the outside through electron emitting holes 18.

The plasma electrode 16 is in contact with a plasma 20 and is operative to ensure an electric potential of the plasma 20. The electric potential of the plasma electrode 16 is set the same as that of a plasma generating chamber 12. When the plasma generating chamber 12 is internally completely covered with the insulator, no conductor is in contact with the plasma 20, no current flows in the plasma 20, and the electrons can hardly be extracted from the plasma 20. However, the plasma electrode 16 can prevent such situations from occurring.

If the plasma generator 10 is driven for a prolonged period (for example, approximately a few hundred hours to a few thousand hours), the PFG current decreases to such an extent so as to be of no use.

If the PFG current Ipfg decreases as described above and neutralization of charge-up of the substrate cannot be performed adequately, the plasma generator has to be removed for clearing the insulating material accumulated on the plasma electrode 16. This results in stoppage of the ion beam irradiation device for maintenance for a long time.

A plasma is a good conductor and by itself is quasi-neutral. Therefore, an electron current lost from the plasma and an ion current are always equal in magnitude. Because a decrease in plasma electrons takes place due to extraction of an electron current from a PFG (PFG current Ipfg), the same amount of ions needs to be lost from the plasma.

Although the ions can obtain the electrons by recombining in the plasma, the electron current lost from the plasma cannot be compensated. An ion current flow is initiated only when the ions collide against the wall, releasing the electrons from the wall.

When the ions collide against the wall, the ions recombine with the electrons at the wall and are converted back into a neutral gas. These electrons are supplied by a PFG power supply 30 through a conductive wall. The PFG power supply 30 also extracts electrons from the PFG, and supplies an amount of electrons to a PFG plasma via the ions that is equal to the amount of electrons that flow into a vacuum chamber. As a result, an outflow current is maintained equal to a feedback current of the power supply.

Thus, for the PFG current Ipfg to flow, the conductive wall must be in contact with the plasma. If the surface of the plasma electrode 16 becomes insulating because of deposition of an insulating material generated due to sputtering, etc., of alumina that is provided on the inner wall of the plasma generating chamber, no PFG current Ipfg will flow.

SUMMARY OF THE INVENTION

In the present invention, a protruding structure is provided on a frame cover in the high-frequency discharge plasma generator. Due to this, a shadow is created over the plasma electrode and a portion that will not be coated with the insulating material generated in sputtering of alumina is secured on the plasma electrode, thus preventing decrease in the PFG current Ipfg.

The frame cover should preferably be made of a conductive material such as carbon. The conductive frame cover also functions as an electrode, increasing a surface area of the conductive wall, and as a result, increasing the PFG current Ipfg. The PFG current Ipfg flows until a point in time at which the entire surface of the plasma electrode and the frame cover are coated with the insulating material. Thus, the life of the plasma generator can be prolonged not only by preventing the insulation of the plasma electrode but also by increasing the PFG current Ipfg. The carbon can be pyrolytic graphite having strong plasma resistant properties.

In view of the above discussion, because the object is to only increase the surface area that is in contact with the plasma, the plasma electrode can be arranged at any position as long as it is in contact with the plasma, for example, at the edge of the plasma.

DETAILED DESCRIPTION OF THE PREFERRED EMBODIMENTS

Figure 1:
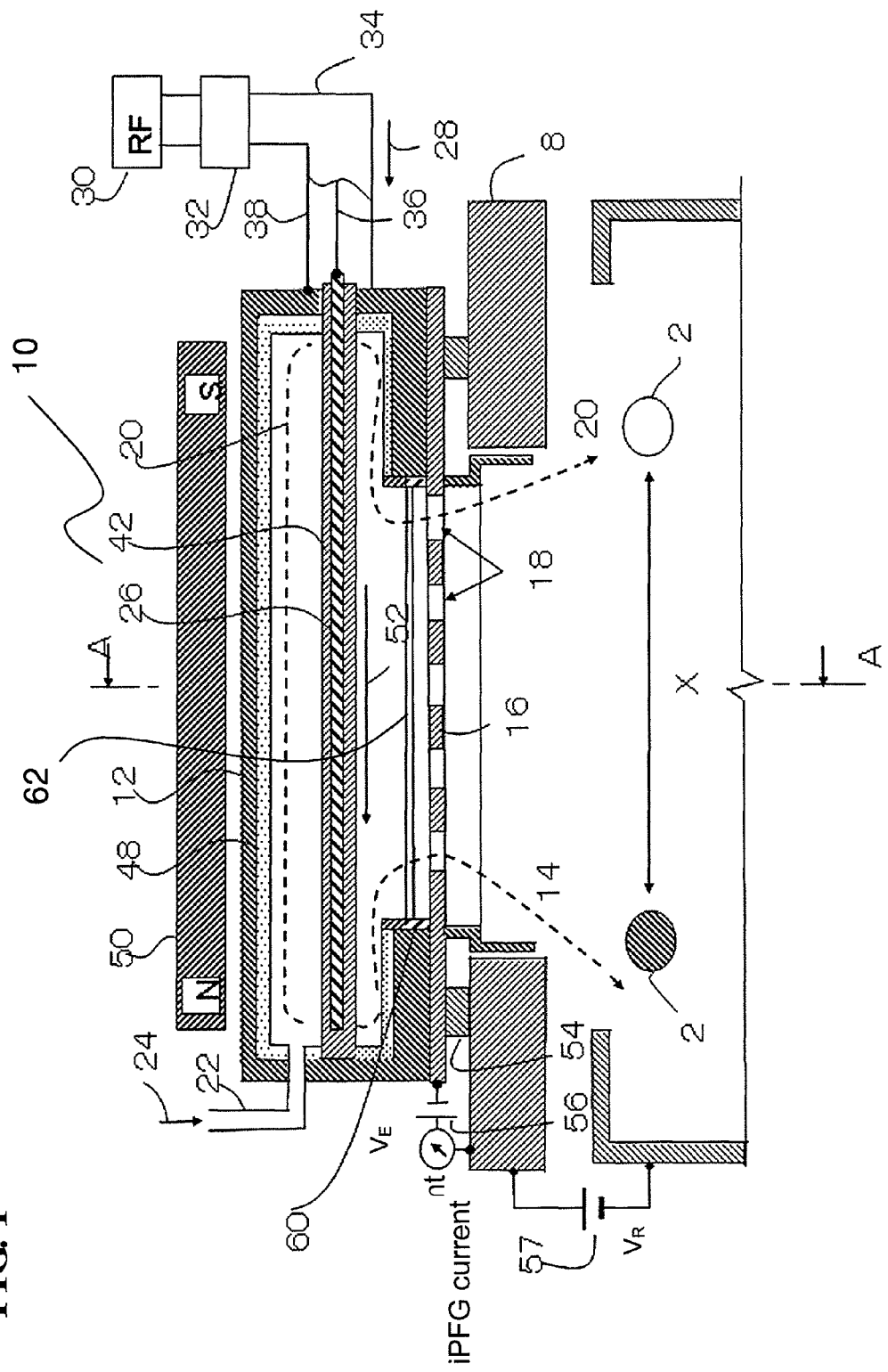
FIG. 1 is a cross-sectional view of a plasma generator according to an embodiment of the present invention.
Figure 2:
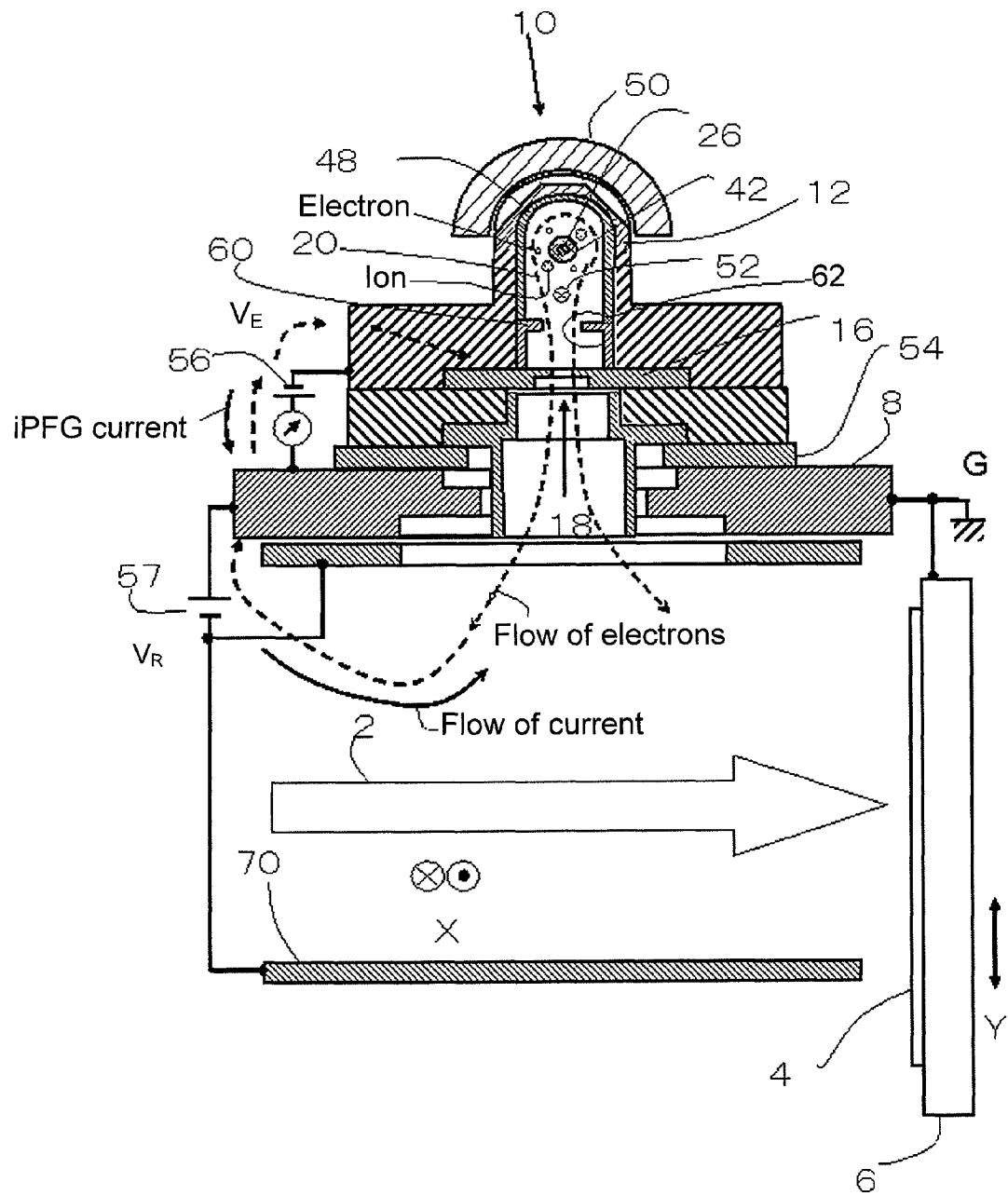
FIG. 2 is a cross-sectional view taken along a line A-A of FIG. 1.

Exemplary embodiments of a plasma generator according to the present invention are explained below with reference to the accompanying drawings. In FIGS. 1 and 2, a configuration is explained as an example in which a plasma generator 10 is used in an ion beam irradiation device (this device is called an ion implantation apparatus when ion implantation is performed) that performs a process of ion implantation, etc., into a substrate 4 by irradiating the substrate (for example, semiconductor substrate) 4 with an ion beam 2 in a target chamber 8. The plasma generator 10 is attached outside the target chamber 8 located in the vicinity of an upstream side of the substrate 4 via an insulator 54.

In this example, the ion beam 2 is reciprocally scanned in an X direction (for example, horizontal direction) by the action of an electric field or a magnetic field. The substrate 4 is secured to a holder 6, and reciprocally scanned in a mechanical manner in a Y direction (for example, orthogonal direction) that crosses the X direction. Due to the coordination of both of the scanning systems (hybrid scanning), an entire surface of the substrate 4 is uniformly irradiated with the ion beam 2, thus enabling a highly uniform ion implantation to be performed.

While the substrate 4 is being scanned, electrons in a plasma emitted from the plasma generator 10 are supplied to the vicinity of the ion beam 2 or the substrate 4. These electrons neutralize a positive charge caused by ion beam irradiation, thereby suppressing an electrostatic charge on the surface of the substrate 4.

To cope with the scanning of the ion beam 2 in the X direction, the plasma generator 10 of the present embodiment has a structure that is elongated in the X direction. Thus, the electrons in the plasma that is wide in the X direction are emitted and uniformly supplied to the vicinity of the ion beam 2 scanned in the X direction. As a result, the electrostatic charge on the surface of the substrate 4 can be uniformly suppressed.

The plasma generator 10 includes a cylindrical plasma generating chamber 12 (specifically, semicylindrical) that is elongated along the X direction. The plasma generating chamber 12 is made of a non-magnetic material. The non-magnetic plasma generating chamber 12 does not disturb a magnetic field 52 generated by a magnet 50, which is described later. A plasma electrode 16 is also made of a non-magnetic material.

A gas introducing pipe 22 is connected to one end of the plasma generating chamber 12 (on a left side in FIG. 1). A gas 24, for example, xenon, is introduced into the plasma generating chamber 12 from the gas introducing pipe 22.

The plasma generating chamber 12 has an opening 14 in a portion, specifically, on a lower side (the side facing the ion beam 2) of the plasma generating chamber 12. The plasma electrode 16 is provided in the opening 14. The plasma electrode 16 has an electron emitting hole 18 through which the electrons in the plasma generated in the plasma generating chamber 12 are emitted outside the plasma generating chamber 12. In the present embodiment, the electron emitting hole 18 includes a plurality of holes (for example, circular holes or elongated holes) arranged in a line in the X direction. Alternatively, the electron emitting hole 18 can be a slit extending along the X direction. The plasma electrode 16 is electrically connected to the plasma generating chamber 12, and has the same electric potential as the plasma generating chamber 12.

A straight rod-like antenna 26 is provided in the plasma generating chamber 12. The antenna 26 extends along a longitudinal axis of the plasma generating chamber 12, that is, along the X direction. A length of the antenna 26 in the plasma generating chamber 12 is, for example, about 80% to 100% of a length of the plasma generating chamber 12 along the longitudinal axis. The antenna 26 is inserted into the plasma generating chamber 12, for example, from the other end (right side in FIG. 1) of the plasma generating chamber 12. The antenna 26 is made of, for example, tungsten. The antenna 26 is covered with an antenna cover 42, or some other insulator (not shown), thereby electrically insulating the antenna 26.

A high-frequency wave 28 is supplied from a PFG power supply 30 to the antenna 26 via an impedance matching circuit 32 and a coaxial cable 34. The high-frequency wave 28 can be a high frequency wave of approximately 13.56 megahertz (MHz) or a microwave of a frequency of approximately 2.45 gigahertz (GHz). That is, high frequency in the present description encompasses frequencies in the microwave band. A central conductor 36 and an outer conductor 38 of the coaxial cable 34 are, respectively, electrically connected to the antenna 26 and the plasma generating chamber 12.

With the structure described above, the high-frequency wave 28 supplied to the antenna 26 from outside is emitted from the antenna 26 into the plasma generating chamber 12 and a plasma 20 is generated by ionizing the gas 24 with a high-frequency discharge in the plasma generating chamber 12. As a result, the electrons in the plasma 20 are emitted into the target chamber 8 through the electron emitting hole 18.

A negative extracting voltage $V_E$ can be applied to the plasma generating chamber 12 and the plasma electrode 16 having the same electric potential as that of the plasma generating chamber 12, using a direct current extracting power supply 56 with an electric potential of the target chamber 8 as a reference. This configuration allows easy emission of the electrons from the electron emitting hole 18.

With the electric potential of the target chamber 8 as the reference, a negative reflector voltage $V_R$ can be applied to a reflector 70 using a power supply 57. As a result, the electrons in the plasma emitted from the electron emitting hole 18 are reflected by the reflector 70, and are easily captured by the ion beam 2.

The entire antenna 26 located inside the plasma generating chamber 12 is covered with the antenna cover 42 that is made of an insulating material. The antenna cover 42 is made of ceramic such as silica and alumina. Thus, contamination in which metal particles constituting the antenna 26 are discharged from the antenna 26 in sputtering by the plasma 20, to contaminate the plasma, can be prevented from occurring.

According to the present embodiment, it is desirable to cover an inner wall (that is, an inner wall excluding the opening 14) of the plasma generating chamber 12 with an insulator 48. When the electron emitting hole 18 is provided on a side face of the plasma generating chamber 12 instead of providing to the plasma electrode 16, it is desirable to cover the inner wall of the plasma generating chamber 12 excluding the electron emitting hole 18 with the insulator 48. Thus, contamination, in which metal particles constituting the plasma generating chamber 12 are discharged from the plasma generating chamber 12 in sputtering by the plasma 20, to contaminate the plasma, can be prevented from occurring.

A frame cover 60 with a protrusion 62 is provided inside the plasma generating chamber 12 so as to cover a periphery of the plasma electrode 16. Due to this, the insulating material is prevented from accumulating on the surface of the plasma electrode 16 in sputtering by the plasma 20, and conduction is ensured. When the insulating material accumulates on the plasma electrode 16, the conductor cannot contact with the plasma 20, the electric potential cannot be applied to the plasma 20, no current flows in the plasma 20, and the electrons are hardly extracted from the plasma 20. The frame cover 60 with the protrusion 62 is located between the plasma electrode 16 and the antenna 26. The protrusion 62 has different thicknesses inside a frame or inside and outside the frame within the frame having a tubular frame area.

Figure 3:
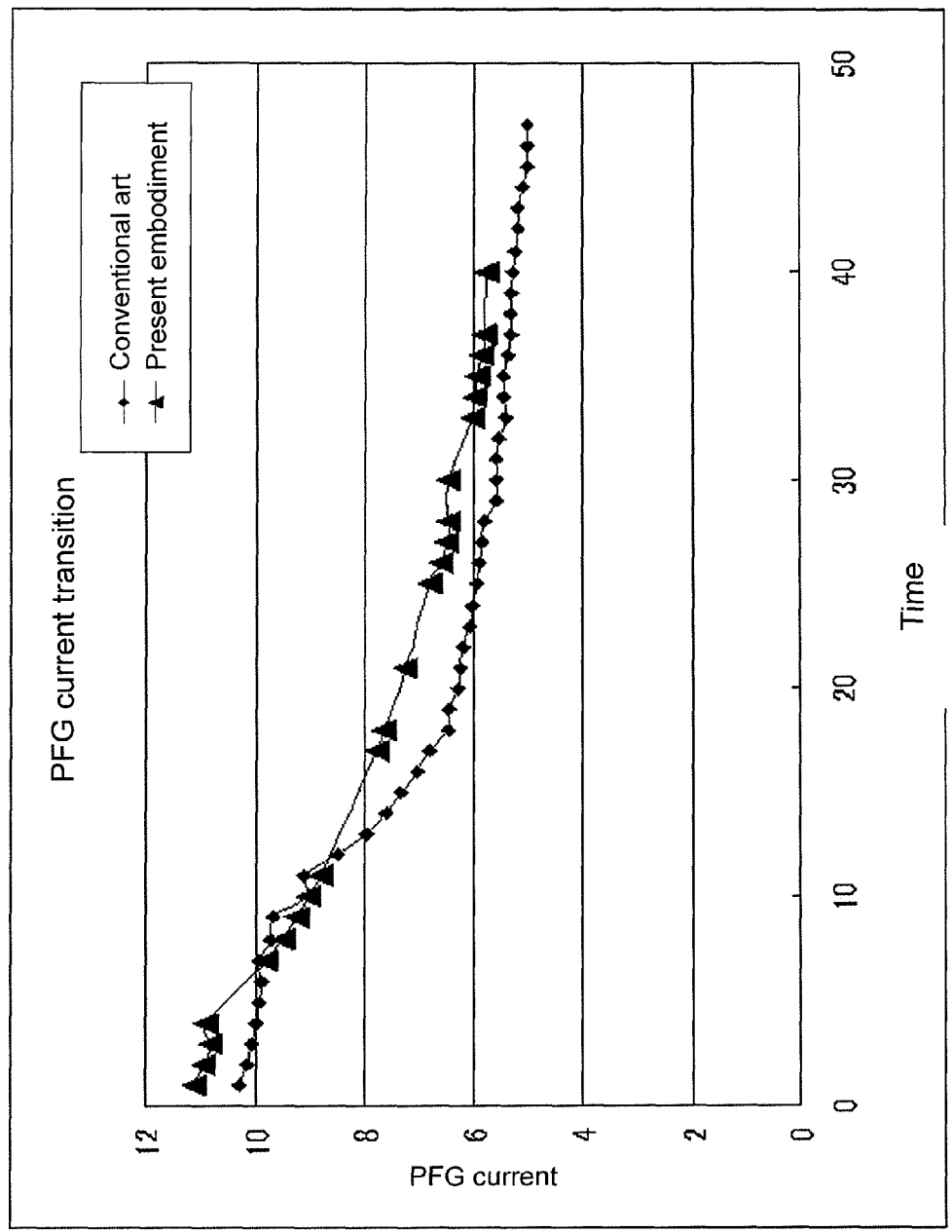
FIG. 3 is a graph that depicts a change in a PFG current before and after the implementation of the invention.

FIG. 3 is a graph that depicts a change in a PFG current Ipfg when the frame cover 60 with the protrusion 62 and when a frame cover 60 without protrusion are provided. As can be seen from FIG. 3, when the frame cover 60 with protrusion 62 is provided, a larger PFG current Ipfg is generated. Therefore, a life of the plasma generator 10 is increased.

Figure 4A:
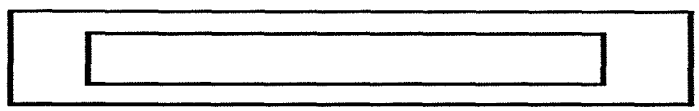
FIGS. 4A to 4D are drawings that depict examples of shapes of a frame cover with protrusion.
Figure 4B:
Figure 4C:
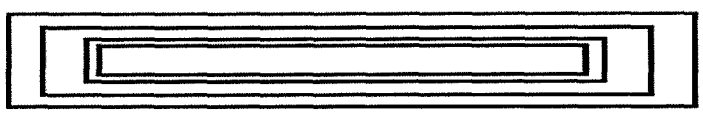
Figure 4D:
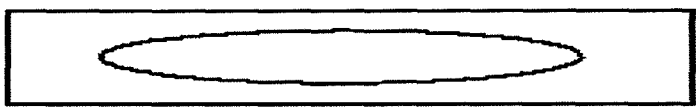

FIGS. 4a to 4d are drawings that depict examples of shapes of the frame cover 60 with the protrusion 62. Protrusions of various shapes that form a shadow on the periphery of the plasma electrode 16 are shown in FIGS. 4a to 4d. FIG. 4a illustrates an example of the protrusion 62 from a top view and a side view. The protrusion 62 has a substantially rectangular cross-section, and a substantially rectangular space is formed. FIG. 4b illustrates an example of the protrusion 62 from a top view and a side view. The protrusion 62 has a substantially beveled profile, such that the space formed within the protrusion 62 is substantially rectangular and beveled. FIG. 4c illustrates an example of the protrusion 62 from a top view and a side view. The protrusion has a diagonally upward projecting profile, such that the space formed within the protrusion 62 is substantially rectangular and upwardly projecting. FIG. 4d illustrates an example of the protrusion 62 from a top view and a side view. The protrusion has a substantially rectangular cross section, and the space formed within the protrusion 62 is substantially circular."

Figure 5:
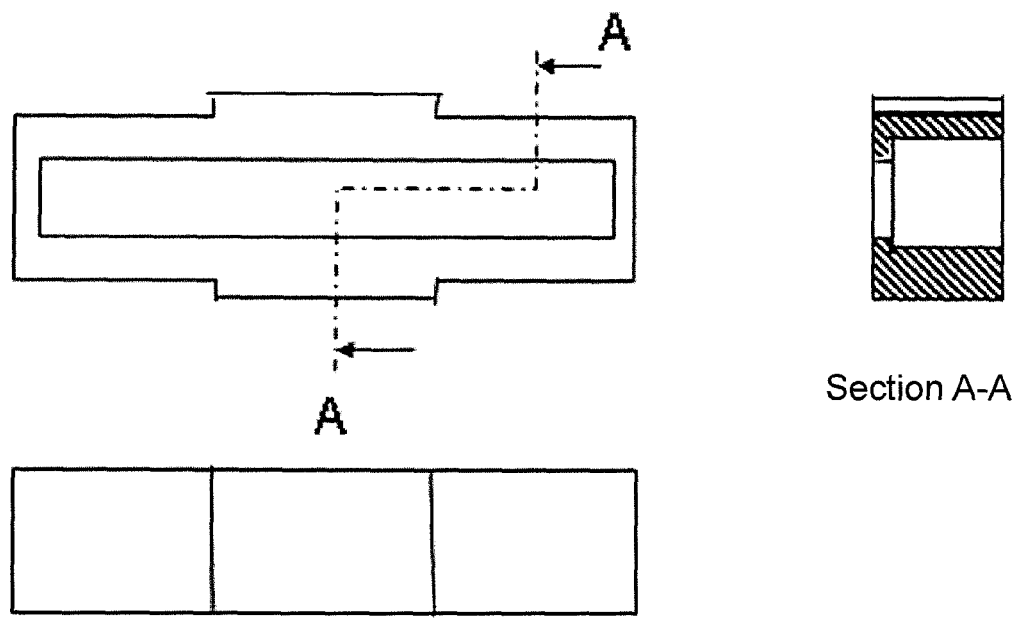
FIG. 5 is a drawing that depicts an example of a shape of the frame cover with protrusion that is outwardly convex.

FIG. 5 is a drawing that depicts an example of a shape of the frame cover 60 with protrusion 62 that is outwardly convex in a central portion. Due to spring characteristics of the frame cover 60, electric contact between the frame cover 60 with the protrusion 62 and the plasma generating chamber 12 can be maintained, and furthermore, the frame cover 60 with protrusion 62 also has the same electric potential as that of the plasma electrode 16. Because the plasma 20 is in contact with a conductive wall, the PFG current Ipfg flows.

Figure 6:
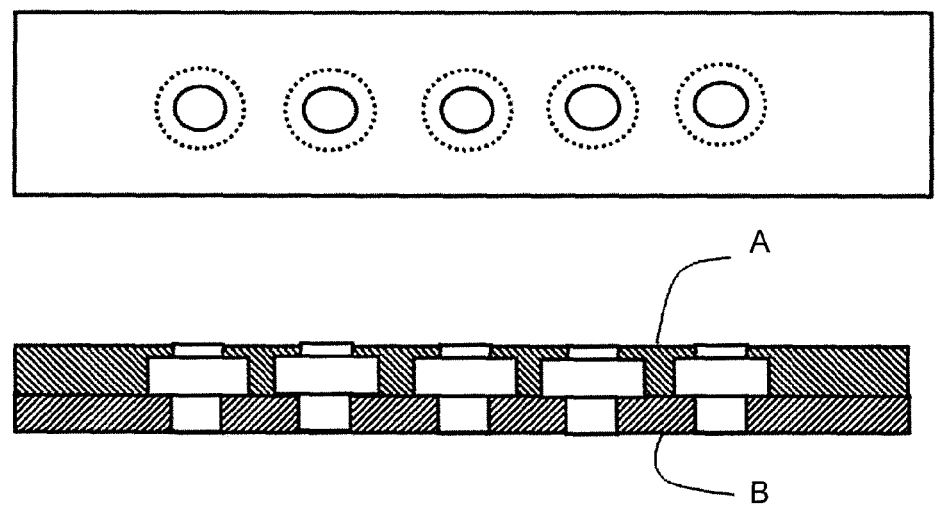
FIG. 6 is a drawing that depicts an example of a shape of a plasma electrode having a protruding structure.

FIG. 6 is a drawing that depicts an example of a shape of a plasma electrode having a protruding structure. The plasma electrode is made of carbon, and has a two-layered structure. A shadow portion is created on a plasma electrode B with a plasma electrode A and an arrangement is made such that the plasma 20 is in contact with the plasma electrode B. Even if the plasma electrode A is covered with an insulating material in sputtering by the plasma 20, because the plasma electrode B and an inner surface of the plasma electrode A are in contact with the plasma 20, the PFG current Ipfg flows.

Figure 7:
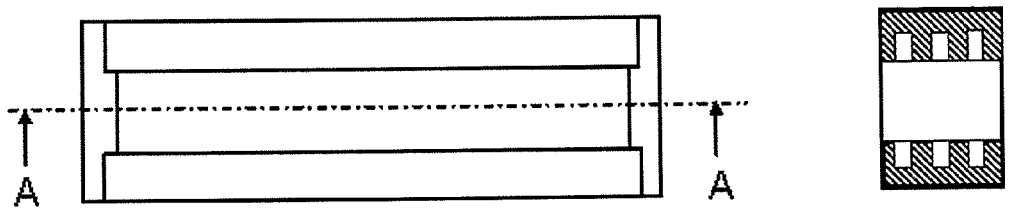
FIG. 7 is a drawing that depicts an example of a shape of the frame cover that has concave depressions on the inside.
Figure 7:
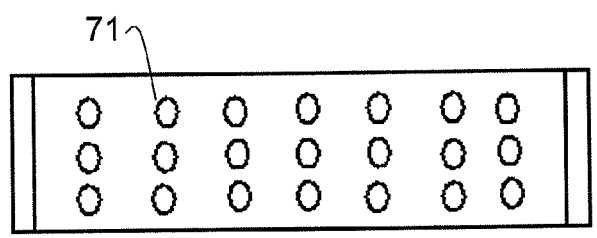

FIG. 7 is a drawing that depicts an example of a shape of the frame cover 60, which has concave portions (e.g., depressions) 71 on the inside. The frame cover 60 is made of carbon. The concave portions 71 on the inside of the frame cover 60 hardly get covered with insulating material in sputtering by the plasma 20, and because the concave portions 71 on the inside of the frame cover 60 come into contact with the plasma 20, the PFG current Ipfg flows.

The magnet 50, which generates the magnetic field 52 along the longitudinal axis of the plasma generating chamber 12, can be arranged outside the plasma generating chamber 12 as in the present embodiment or inside the plasma generating chamber 12. In the present example, the magnet 50 has a semi-cylindrical shape that conforms with the shape of the plasma generating chamber 12. The magnet 50 is typically a permanent magnet. Provision of the magnet 50 facilitates capturing of the electrons by the magnetic field 52 generated by the magnet 50, and generation and maintenance of the plasma 20 inside the plasma generating chamber 12. Therefore, a high density plasma can be produced by electron cyclotron resonance (ECR).

Various components of the plasma generator 10 are described above; however, the structure described is merely an example and the present invention is not limited to the structure described above.

Figure 8:
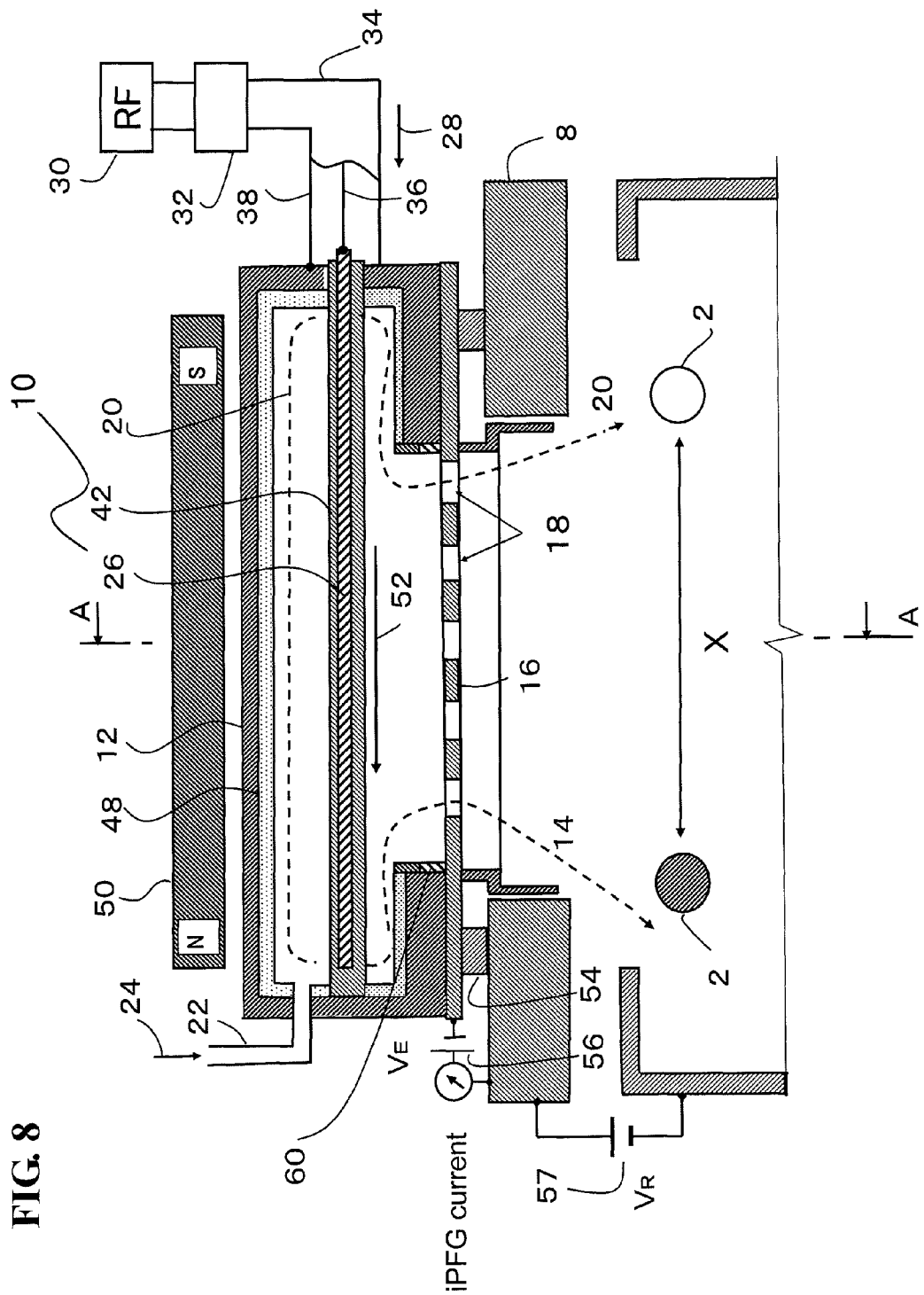
FIG. 8 is a drawing is a cross-sectional view of a plasma generator according to another exemplary embodiment.

FIG. 8 illustrates an exemplary embodiment. In FIG. 8, a plasma generator 10 is used in an ion beam irradiation device (this device is called an ion implantation apparatus when ion implantation is performed) that performs a process of ion implantation, etc., into a substrate 4 by irradiating the substrate (for example, semiconductor substrate) 4 with an ion beam 2 in a target chamber 8. FIG. 8 is substantially similar to FIG. 1, and thus the description of the substantially similar elements is committed for the sake of clarity. The distinguishing characteristic of the exemplary embodiment of FIG. 8 as compared with FIG. 1 is that in FIG. 1, the protrusion 62 is provided at the cover frame 60. However, in the exemplary embodiment of FIG. 8, no protrusion is provided at the cover frame 60.

According to an aspect of the present invention, a shadow over a plasma electrode having electron emitting holes prevents accumulation of an alumina insulating material on the plasma electrode in sputtering by a plasma, and thereby, a decrease in a PFG current can be prevented. As a result, a plasma generator can be used for a prolonged time.

According to another aspect of the present invention, a frame cover is made of carbon that is electrically conductive. The conductive frame cover also functions as an electrode, increasing a surface area of a conductive wall, thus increasing the PFG current. The PFG current flows until the entire surface of the plasma electrode and the frame cover are insulated. Thus, the plasma generator can be used for a prolonged time.

According to still another aspect of the present invention, a central portion of a frame cover with protrusion externally has a convex shape. Due to this, an electrical contact can be maintained between the frame cover with protrusion and a plasma generating chamber, and thereby, a decrease in the PFG current can be prevented. As a result, the plasma generator can be used for a prolonged time.

According to still another aspect of the present invention, the plasma electrode has a protruding structure. Thus, even if the frame cover with protrusion is not provided, a decrease in the PFG current can be prevented. As a result, the plasma generator can be used for a prolonged time.

According to still another aspect of the present invention, the frame cover internally has depressions of a concave shape. The depressions are not coated with the insulating material easily. Furthermore, because the frame cover is made of carbon, by increasing an area of a conductive wall, the PFG current can be increased.

What is claimed is:

1. A plasma generator that generates a plasma by ionizing a gas with a high-frequency discharge in a plasma generating chamber, and emits electrons outside from the plasma through an electron emitting hole, the plasma generator comprising:
    an antenna that is provided in the plasma generating chamber, and that emits a high-frequency wave;
    and an antenna cover that is made of an insulating material and that covers an entire body of the antenna, wherein a plasma electrode having the electron emitting hole is made of a conductive material, and the plasma electrode itself has a protruding structure,
    wherein a shadow is provided by the protruding structure, the plasma electrode having a first plasma electrode portion and a second plasma electrode portion, and the shadow prevents accumulation of an insulating material on the plasma electrode in sputtering by a plasma, and wherein the shadow is created on the first plasma electrode portion with the second plasma electrode portion.

\* \* \* \* \*